United States Patent
Callahan

Patent Number: 5,912,861
Date of Patent: Jun. 15, 1999

[54] ROM/RAM OVERLAP CIRCUIT

[75] Inventor: John M. Callahan, San Ramon, Calif.

[73] Assignee: Enable Semiconductor, Inc., Milpitas, Calif.

[21] Appl. No.: 08/965,386

[22] Filed: Nov. 6, 1997

[51] Int. Cl.$^6$ .................................................. G11C 8/00
[52] U.S. Cl. ................................. 365/233.5; 365/189.08
[58] Field of Search ............................ 365/233.5, 189.08

[56] References Cited

U.S. PATENT DOCUMENTS

| | | | |
|---|---|---|---|
| 5,566,129 | 10/1996 | Nakashima et al. | 365/233.5 |
| 5,652,535 | 7/1997 | Kim et al. | 327/259 |

*Primary Examiner*—David Nelms
*Assistant Examiner*—Hoai V. Ho
*Attorney, Agent, or Firm*—Patrick T. King

[57] ABSTRACT

A control circuit initiates operation of the ROM array and the RAM array in an ATD circuit includes an EXCLUSIVE NOR circuit having: a RAM SELECT input terminal for receiving a RAM SELECT (RAMCS*) signal, a ROM SELECT input terminal for receiving a ROM SELECT (ROMCS*) signal, and having a chip enable output terminal at which is provided a chip enable signal (CE) at an active LOW state whenever the RAMCS* and the ROMCS* are both the same logic level, both either HIGH or LOW. The control circuit further includes a compensating pulse circuit to compensate for operation of the EXCLUSIVE NOR circuit during a dead-time interval in which the EXCLUSIVE NOR circuit does not function when the RAMCS* and the RAMCS* both change during that dead-time interval. The compensating circuit includes a two pulse generators, each generating an output pulse having a pulse width which is greater than the dead-time interval of the EXCLUSIVE NOR circuit. Each pulse generator provides an output pulse when the RAM/ROM SELECT signal goes to a one level after the ROM/RAM SELECT signal has been at a one level and the pulse generator also provides an output pulse when the ROM/RAM SELECT signal switches to a zero level such that the zero transition is delayed by an inverter chain, which quickly passes through a zero-to-one transition and which slowly passes through a one-to-zero transition such that the pulse generator provides an output pulse with a width determined by the slow passage from the one-to-zero transition.

8 Claims, 3 Drawing Sheets

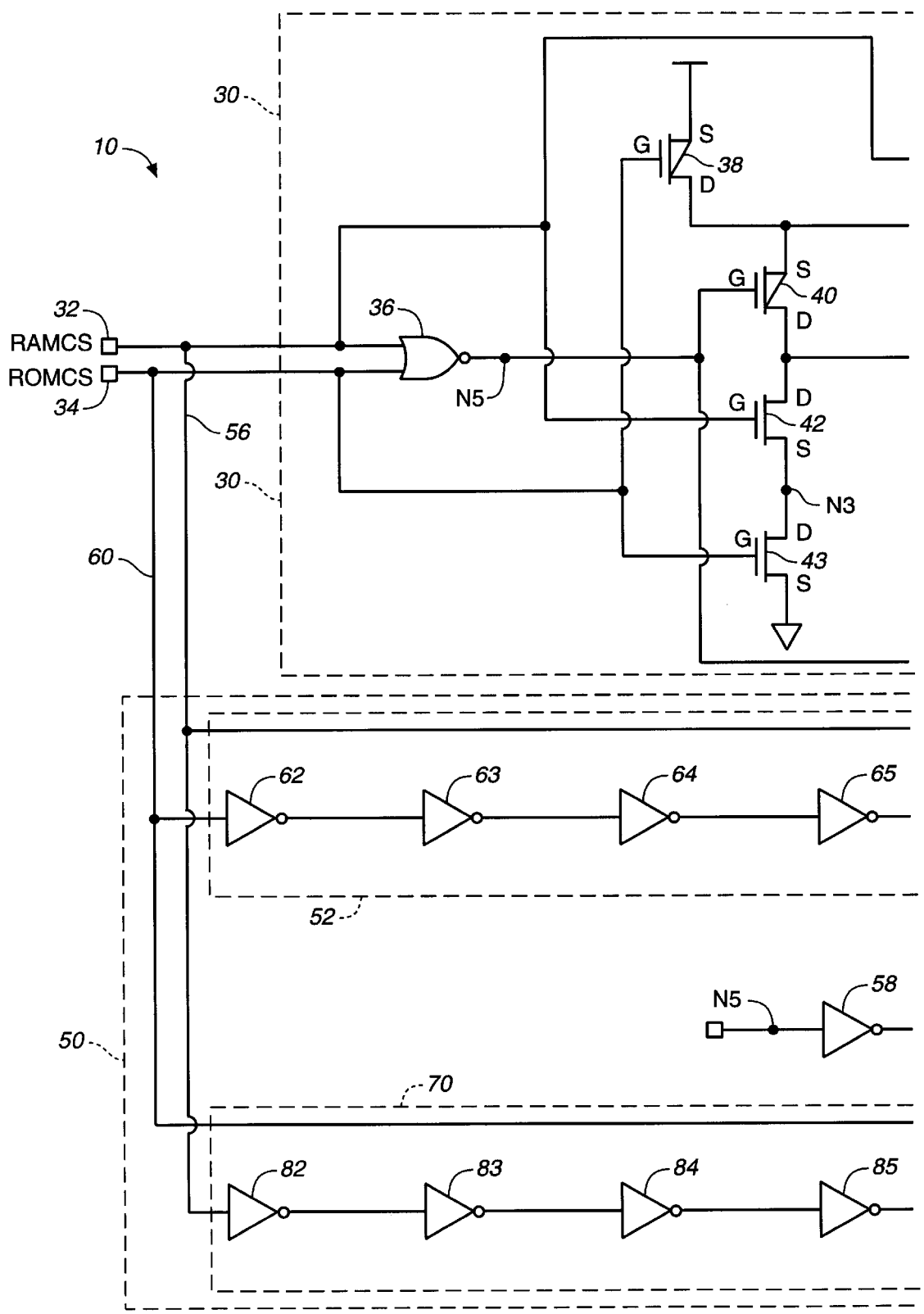
FIG._1A

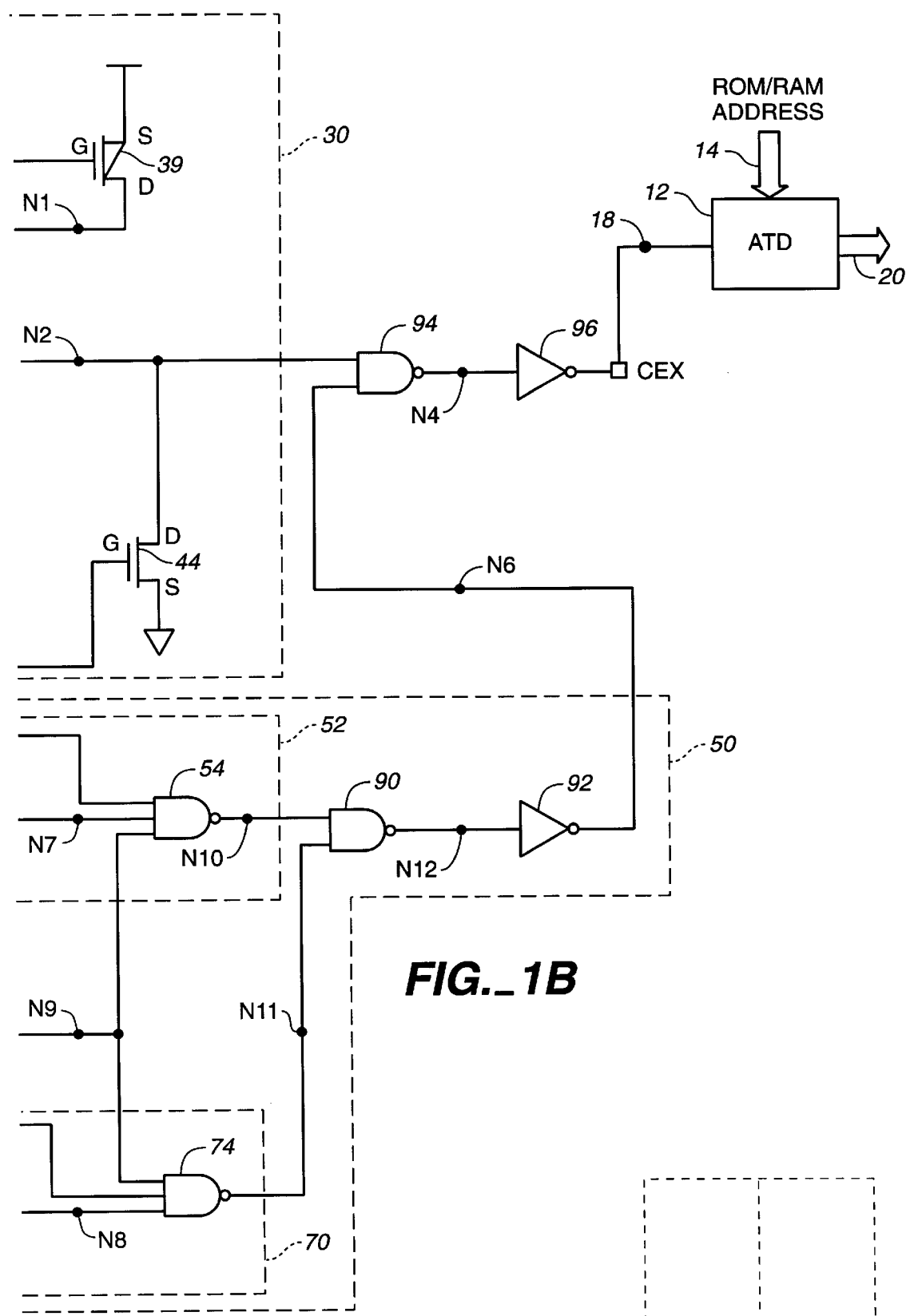
FIG._1B
FIG._1

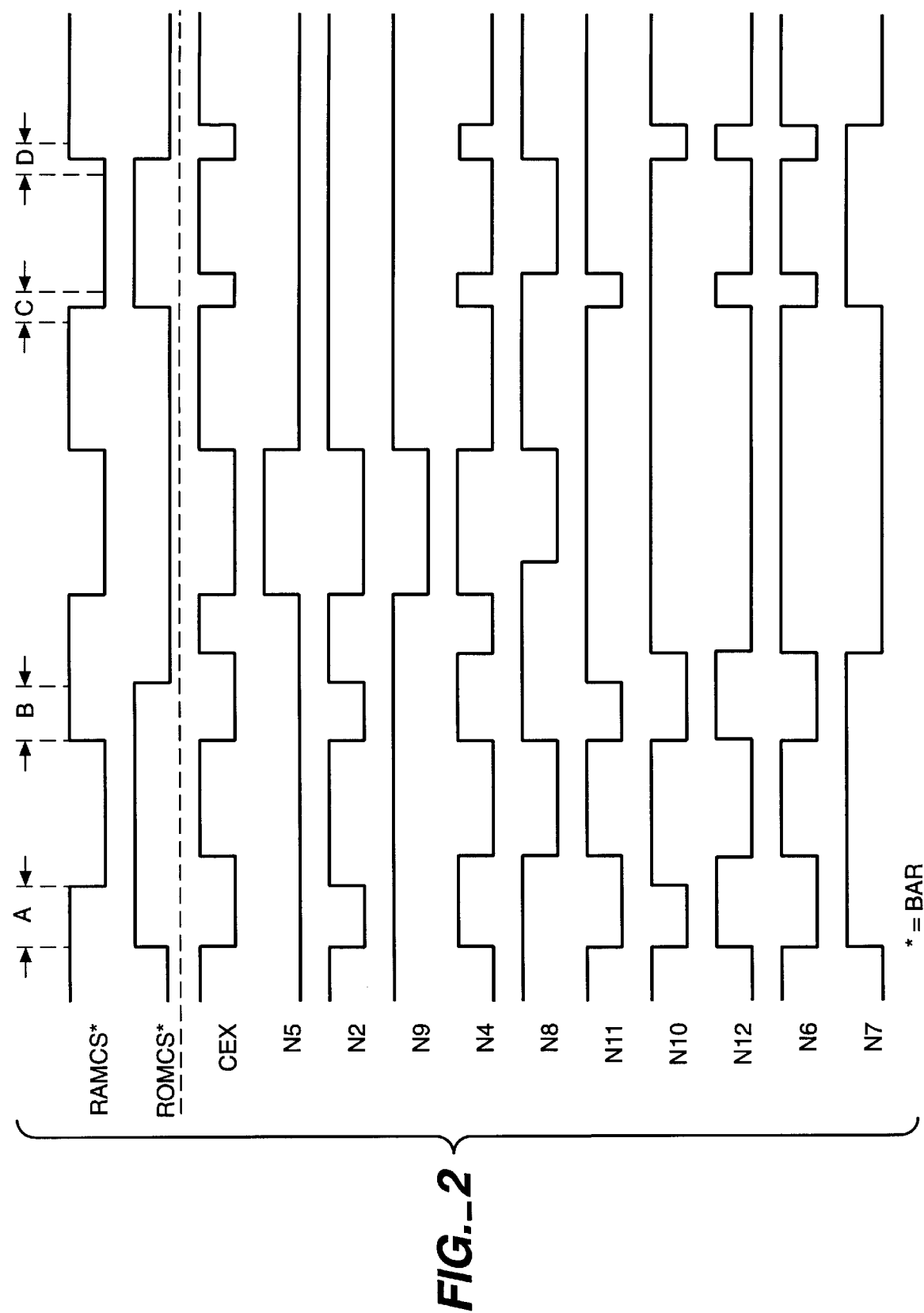
FIG._2

ROM/RAM OVERLAP CIRCUIT

BACKGROUND OF THE INVENTION

1. Field of the Invention

This invention relates to an improved EXCLUSIVE-NOR circuit and, more particularly, to a control circuit which uses an EXCLUSIVE-NOR circuit to aid in selection of a read-only memory ROM or a random-access memory RAM array.

2. Prior Art

Previously, integrated circuits have included both ROM arrays and RAM arrays on the same chip. In order to select the ROM array, a ROM SELECT signal (ROMCS*) is provided which is active when LOW. In order to select the RAM array, a RAM SELECT signal (RAMCS*) is provided which is active when LOW. When different addresses are used for either the RAM array or the ROM array, an address transition detector (ATD) circuit is used to start respective streams of pulses required for operation of either the RAM or ROM arrays. These pulses, for example, precharge the bit lines, turn on sense amplifiers, and enable output buffers.

However, in the case where the same address is used for both the RAM array and the ROM array, there is no address transition to activate the ATD circuit and start the stream of required pulses for a ROM or RAM array. For this situation, prior art circuits modify the ATD circuit so that the ATD circuit reacts to a chip enable signal (CE), where the CE signal is derived from the RAM SELECT signal (RAMCS*) or the ROM SELECT signal (ROMCS*) and CE is normally LOW and active HIGH. CE=1, or is HIGH, when either the RAMCS* signal or the ROMCS* signal is active LOW.

In the situation where the chip is switching operation from the RAM to the ROM occurs or vice-versa, the CE signal is required to go LOW and then to go HIGH. This requires that the RAMCS* signal and the ROMCS* signal both be off momentarily, or HIGH.

However, a problem arises in the situation where both arrays are turned on in the situation where either the ROM is turned on before turning off the RAM or else the RAM is turned on before turning off the ROM. In either case, the CE signal never goes LOW, as is required to activate the ATD circuit. In this case, the CE signal just stays HIGH so that the ATD circuit is not activated to initiate the required pulses for proper operation of the RAM or ROM array. A solution to this problem is to use an XNOR circuit in a CE buffer circuit so that whenever the ROMCS* and the RAMCS* signals are the same, CE goes LOW.

However, a problem arises with using the XNOR circuit because the XNOR circuit does not react instantaneously when the ROM and RAM arrays are simultaneously switched. There is a time interval centered about the simultaneous switching time during which time interval the XNOR circuit does not function as required.

Consequently a need exists for improvement to the operation of the XNOR circuit so that a CE signal is provided to activate the ATD circuit even when the ROM and RAM are switched simultaneously.

SUMMARY OF THE INVENTION

It is therefore an object of the invention to provide an improved EXCLUSIVE NOR circuit which provides a CE signal for a ROM/RAM even when the ROM and the RAM circuits are switched simultaneously.

In accordance with these and other objects of the invention, a control circuit for initiating operation of a ROM array and a RAM array in an integrated-circuit chip having an address transition detector (ATD) circuit is provided for initiating operation of the ROM array and the RAM array in an ATD circuit. The control circuit includes an EXCLUSIVE NOR circuit having: a RAM SELECT input terminal for receiving a RAM SELECT (RAMCS*) signal, a ROM SELECT input terminal for receiving a ROM SELECT (ROMCS*) signal, and having a chip enable output terminal at which is provided a chip enable signal (CE) at an active LOW state whenever the RAMCS* and the ROMCS* are both the same logic level, both either HIGH or LOW.

The control circuit includes a compensating pulse circuit to compensate for operation of the EXCLUSIVE NOR circuit during a dead-time interval in which the EXCLUSIVE NOR circuit does not function to provide an output signal at the chip enable output terminal when the RAMCS* and the RAMCS* both change during that dead-time interval. The compensating circuit includes a two pulse generators, each generating an output pulse having a pulse width which is greater than the dead-time interval of the XNOR circuit.

The first pulse generator provides an output pulse when the RAM SELECT signal goes to a one level after the ROM SELECT signal has been at a one level and the first pulse generator also provides an output pulse when the ROM SELECT signal switches to a zero level such that the zero transition is delayed by a first inverter chain, which quickly passes through a zero-to-one transition and which slowly passes through a one-to-zero transition such that the first pulse generator provides an output pulse with a width determined by the slow passage from the one-to-zero transition.

The second pulse generator provides an output pulse when the ROM SELECT signal goes to a one level after the RAM SELECT signal has been at one level and also when the RAM SELECT signal switches to a zero level such that the zero transition is delayed by a second inverter chain which quickly passes through a zero-to-one transition and which slowly passes through a one-to-zero transition such that the second pulse generator provides an output pulse with a width determined by the slow passage from the one-to-zero transition.

A first combining circuit, such as a NAND gate, combines the output pulses of the first and second pulse generators to provide a compensating circuit output signal. A second combining circuit combines the compensating circuit output signal with the output signal of the EXCLUSIVE NOR circuit to provide a chip enable signal for the ATD circuit.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 1A and 1B are schematic circuit diagram of a ROM/RAM overlap control circuit according to the invention.

FIG. 2 is a timing diagram showing operation of a ROM/RAM control circuit according to the invention user various conditions.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIGS. 1A and 1B show a control circuit 10 for initiating operation of a ROM array and a RAM array in an integrated-circuit chip having an address transition detector (ATD) circuit 12. The ATD circuit 12 receives a set of ROM/RAM address signals from a ROM/RAM address bus 14. The ATD circuit 12 has a chip enable input terminal 18 for receiving a chip enable signal (CEX). As indicated by the bus 20, the ATD circuit 12 has output terminals which are connected to conductors in the bus 20 to provide pulses for initiating operation of the ROM array and the RAM array. The CEX signal is used to start respective streams of pulses required for operation of either the RAM or ROM arrays, including, for example, precharging the bit lines, turning on sense amplifiers, and enabling output buffers.

The control circuit 10 includes an EXCLUSIVE NOR (XNOR CIRCUIT) 30. A RAM SELECT input terminal 32 receives a RAM SELECT (RAMCS*) signal. A ROM SELECT input terminal 34 receives a ROM SELECT (ROMCS*) signal. Each input terminal 32, 34 is connected to a respective input terminal of a NOR gate 36, the output terminal of which is connected to a node N5. When both the RAMCS* signal and the ROMCS* signal are at a zero, or LOW, level, then node N5 goes to a one, or HIGH, level. The XNOR circuit 30 includes three PMOS transistors 38, 39, 40 and three NMOS transistors 42, 43, 44, connected as illustrated in FIGS. 1A and 1B.

An output terminal for the XNOR circuit is connected to a node N2. The XNOR circuit usually provides a chip enable output signal (CE) at an active LOW state whenever the RAMCS* and the ROMCS* are both the same logic level, that is, both either HIGH or LOW, except when the ROM and RAM arrays are simultaneously switched. In that case the XNOR circuit does not react instantaneously and there is a time interval centered about the simultaneous switching time during which the XNOR 30 circuit does not function as required.

A compensating pulse circuit 50 provides a compensating CE signal for operation of the EXCLUSIVE NOR circuit during the dead-time interval when the RAMCS* and the RAMCS* both change simultaneously such that the EXCLUSIVE NOR circuit does not provide an output signal at the chip enable output terminal.

The compensating pulse circuit 50 includes a first pulse generator circuit 52 which includes a three-input NAND gate 54. A signal line 56 connects the input terminal 32 for the RAMCS* signal to one input terminal of the NAND gate 54. Node N5 at the output of the NOR gate 36 is connected to an input terminal of an inverter 58, the output terminal of which is connected to node N9 and to another input terminal of the NAND gage 54. A signal line 60 connects the input terminal 34 for the ROMCS* signal to the input terminal of a chain of four inverters 62, 63, 64, 65 connected in series. The output terminal of the last inverter 65 is connected to a node N7 and to the third input terminal of the NAND gate 54. The string of four inverters is designed to operate as a delay line for transitions from a one to a zero level. The output terminal of the NAND gate 54 is the output terminal of the first pulse generator circuit 52 and is connected to node N10.

The first pulse generator 52 provides an output pulse at node 10 when the RAM SELECT signal goes to a one level after the ROM SELECT signal has been at a one level. The first pulse generator 52 also provides an output pulse when the ROM SELECT signal switches to a zero level such that the zero transition is delayed by the inverter chain, which quickly passes through a zero-to-one transition and which slowly passes through a one-to-zero transition such that the first pulse generator 52 provides an output pulse with a width determined by the slow passage from the one-to-zero transition.

The compensating circuit 50 also includes a second pulse generator 70, which functions similar to the first pulse generator 52, described herein above. The second pulse generator circuit 70 includes a three-input NAND gate 74. The signal line 60 also connects the input terminal 34 for the ROMCS* signal to one input terminal of the NAND gate 74. The output terminal of the inverter 58 is also connected to another input terminal of the NAND gate 74. The signal line 56 also connects the input terminal 32 for the RAMCS* signal to the input terminal of a chain of four inverters 82, 83, 84, 85 connected in series. The output terminal of the last inverter 85 is connected to a node N8 and to the third input terminal of the NAND gate 74. The string of four inverters is also designed to operate as a delay line for transitions from a one to a zero level. The output terminal of the NAND gate 74 is the output terminal of the second pulse generator circuit 70 and is connected to node N11.

The first pulse generator 52 provides an output pulse at node 10 when the RAM SELECT signal goes to a one level after the ROM SELECT signal has been at a one level. The first pulse generator 52 also provides an output pulse when the ROM SELECT signal switches to a zero level such that the zero transition is delayed by the inverter chain, which quickly passes through a zero-to-one transition and which slowly passes through a one-to-zero transition such that the first pulse generator 52 provides an output pulse with a width determined by the slow passage from the one-to-zero transition.

A first combining circuit such as a NAND gate 90 has its input terminals respectively connected to the output terminals of the first and second pulse generators 52, 70. The NAND gate 90 combines the output pulses of the first and second pulse generators to provide a compensating circuit output signal at node N12 which is inverted through an inverter 92 to provide a compensating signal at node N6 under the conditions as described herein above.

A second combining circuit such as the NAND gate 94 combines the compensating circuit output signal at node N6 with the output signal for the EXCLUSIVE NOR circuit at node N2. The output signal of the NAND gate 94 is inverted with an inverter 96 to provide a chip enable signal CEX for the ATD circuit at input terminals 18 of the ATD circuit 12.

FIG. 2 illustrates operation of the control circuit 10 by showing the signals at various nodes for various RAMCS* and the RAMCS* signal combinations. The two pulse generators 52, 70 provide that the width of each CEX pulse is greater than the width of the failure, or dead, time of the XNOR circuit. Each pulse circuit generates a CEX pulse when the input RAM or ROM select signal goes to a ONE, after the other input has been at a ONE. If the other input RAM or ROM select signal also switches to a ZERO at the same time, this transition is delayed by one of the four-inverter chains. The inverter chains are designed to quickly pass through a ZERO to ONE transition but are also designed to slowly pass along a ONE-to-ZERO transition.

This slow passage of a ONE-to-ZERO transition creates the pulse width. The compensating circuit 10 prevents both the ROM and RAM arrays on the chip from being on at the same time, fighting each other.

As illustrated in FIG. 2, the time intervals A and B illustrate signal overlap conditions that are sufficiently long such that the XNOR circuit can itself handle those conditions to provide an appropriate signal at node N2 to trigger the ATD circuit.

As also illustrated in FIG. 2, the time intervals C and D illustrate signal overlap conditions to which the XNOR circuit cannot react and cannot provide an appropriate signal on N2 so that N2 remains locked in a HIGH state. In the case where the XNOR circuit cannot react, the COMPENSATING PULSE CIRCUIT provides an appropriate signal at N6, which is transferred to the CEX input terminal 18 of the ATD circuit 12. Comparison of the RAMCS signal with the signal at node N7 shows no delay for ZERO-to-ONE transitions, but the signal at node N7 is delayed for ONE-to-ZERO transitions. Comparison of the ROMCS signal with the signal at node N8 shows no delay for ZERO-to-ONE transitions, but the signal at node N8 is delayed for ONE-to-ZERO transitions. This allows compensating pulses to be generated at respective nodes N10 and N11. These compensating pulses then are transferred to the CEX input terminal of the ATD circuit 12.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A control circuit for initiating operation of a ROM array and a RAM array in an integrated-circuit chip having an address transition detector (ATD) circuit having a set of RAM/ROM address input terminals for receiving address signals for a RAM/ROM array having a chip enable input terminal for receiving a chip enable signal (CEX), and having output terminals at which are provided pulses for initiating operation of the ROM array and the RAM array, comprising:

an EXCLUSIVE NOR circuit having a RAM SELECT input terminal for receiving a RAM SELECT (RAMCS*) signal, having a ROM SELECT input terminal for receiving a ROM SELECT (ROMCS*) signal, and having a chip enable output terminal at which is provided a chip enable signal (CE) at an active LOW state whenever the RAMCS* and the ROMCS* are both the same logic level, both either HIGH or LOW;

a compensating pulse circuit to compensate for operation of the EXCLUSIVE NOR circuit during a dead-time interval in which the EXCLUSIVE NOR circuit does not function to provide an output signal at the chip enable output terminal when the RAMCS* and the RAMCS* both change during that dead-time interval, the compensating circuit including:

a first pulse generator for generating an output pulse having a pulse width which is greater than the dead-time interval of the EXCLUSIVE NOR circuit, the first pulse generator provides an output pulse when the RAM SELECT signal goes to a one level after the ROM SELECT signal has been at a one level and the first pulse generator also provides an output pulse when the ROM SELECT signal switches to a zero level such that the zero transition is delayed by a first inverter chain, which quickly passes through a zero-to-one transition and which slowly passes through a one-to-zero transition such that the first pulse generator provides an output pulse with a width determined by the slow passage from the one-to-zero transition;

a second pulse generator for generating an output pulse having a pulse width which is greater than the dead-time interval of the EXCLUSIVE NOR circuit, the first pulse generator providing the output pulse when the ROM SELECT signal goes to a one level after the RAM SELECT signal has been at one level and also when the RAM SELECT signal switches to a zero level such that the zero transition is delayed by a second inverter chain which quickly passes through a zero-to-one transition and which slowly passes through a one-to-zero transition such that the second pulse generator provides an output pulse with a width determined by the slow passage from the one-to-zero transition;

a first combining circuit for combining the output pulses of the first and second pulse generators to provide a compensating circuit output signal; and a second combining circuit for combining the compensating circuit output signal with the output signal of the EXCLUSIVE NOR circuit to provide a chip enable signal for the ATD circuit.

2. The control circuit of claim 1 wherein the first pulse generator of the compensating pulse circuit includes a first NAND gate which receives the RAM SELECT signal and the output signal of the first inverter chain.

3. The control circuit of claim 1 wherein the second pulse generator of the compensating pulse circuit includes a second NAND gate which receives the ROM SELECT signal and the output signal of the second inverter chain.

4. The control circuit of claim 1 including a pulse generator gating circuit for enabling operation of the first and second NAND gates.

5. The control circuit of claim 1 wherein the first combining circuit for combining the output signals of the first and second pulse generators to provide a compensating circuit output signal includes a third NAND gate having input terminals coupled to the output terminals of the first and second pulse generators.

6. The control circuit of claim 5 including an inverter circuit having an input terminal coupled to the output terminal of the third NAND gate and having an output terminal coupled to the second combining circuit.

7. The control circuit of claim 1 wherein the second combining circuit for combining the compensating circuit output signal with the output signal of the EXCLUSIVE NOR circuit to provide a CEX signal for the ATD circuit includes a fourth NAND gate having input terminals coupled to the output terminals of the EXCLUSIVE NOR circuit and the compensating circuit.

8. The control circuit of claim 7 including an inverter circuit coupled to the output terminal of the fourth NAND gate and having an output terminal coupled to the chip enable input terminal of the ATD circuit.

\* \* \* \* \*